United States Patent [19]

Wen

[11] Patent Number: 4,873,561
[45] Date of Patent: Oct. 10, 1989

[54] HIGH DYNAMIC RANGE CHARGE-COUPLED DEVICE

[76] Inventor: David D. Wen, 248 Delphi Cir., Los Altos, Calif. 94022

[21] Appl. No.: 183,111

[22] Filed: Apr. 19, 1988

[51] Int. Cl.⁴ ............................................. H01L 29/78
[52] U.S. Cl. ........................................ 357/24; 357/30
[58] Field of Search ................. 357/24 R, 24 M, 30

[56] References Cited

U.S. PATENT DOCUMENTS

| | | | |
|---|---|---|---|
| 3,845,295 | 10/1974 | Williams et al. | 250/211 J |
| 3,896,485 | 7/1975 | Early | 357/24 |
| 3,931,465 | 1/1976 | Levine | 178/7.1 |
| 3,932,775 | 1/1976 | Kosonocky | 307/311 |
| 3,996,600 | 12/1976 | Patrin | 357/30 |
| 4,174,528 | 11/1979 | White | 358/280 |
| 4,322,753 | 3/1982 | Ishihara | 358/213 |
| 4,369,378 | 1/1983 | Rockett | 357/24 |
| 4,374,334 | 2/1983 | Engeler | 357/24 |
| 4,450,484 | 5/1984 | Terakawa et al. | 358/213 |

Primary Examiner—William L. Sikes
Assistant Examiner—Robert E. Wise

[57] ABSTRACT

A high dynamic range charge collection circuit is described which includes additional electrodes between the photogate and the transfer gate electrode to create charge transfer wells of different depths. The charge-coupled device has a nonlinear relationship between the charge transferred out of the sensing region and the charge generated in the photosite.

17 Claims, 5 Drawing Sheets

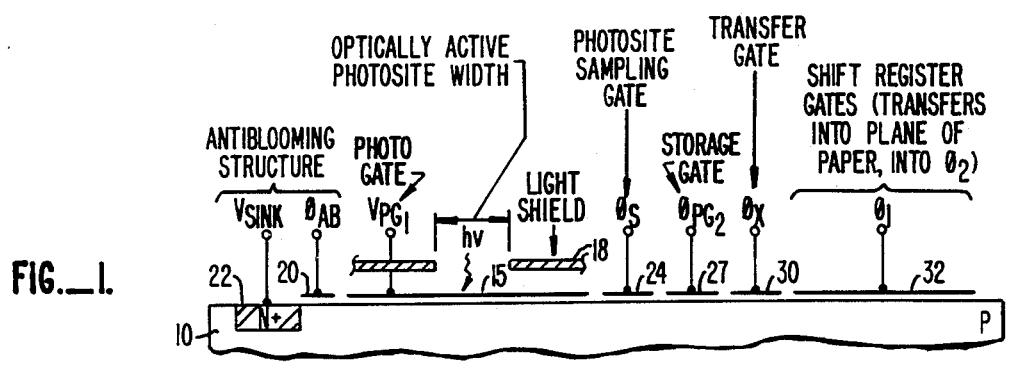
FIG._1.
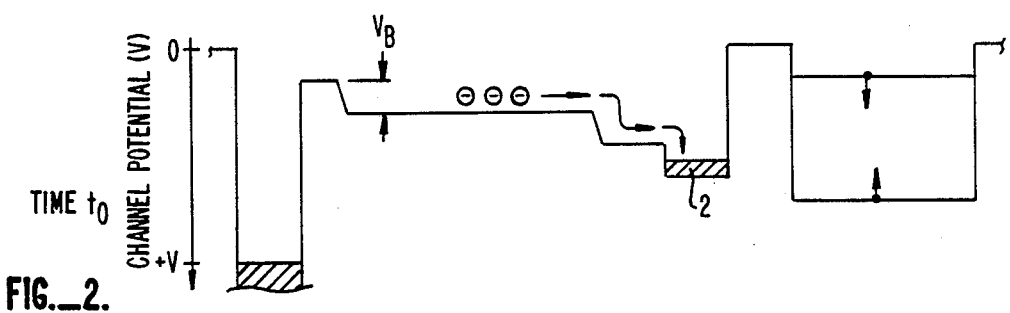
FIG._2.
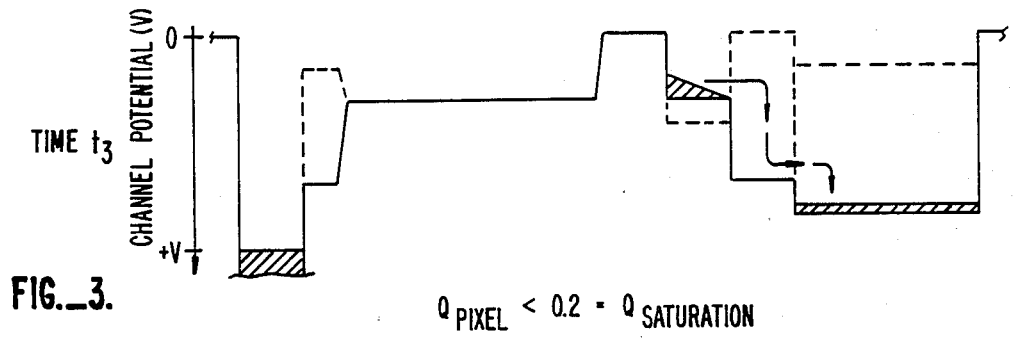
FIG._3.
$Q_{PIXEL} < 0.2 \cdot Q_{SATURATION}$

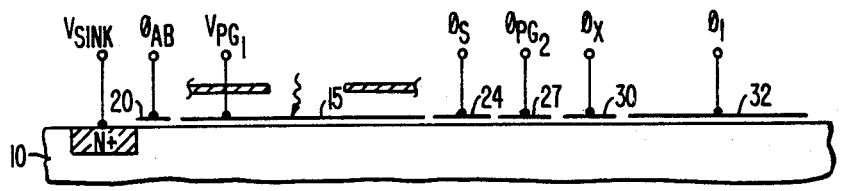
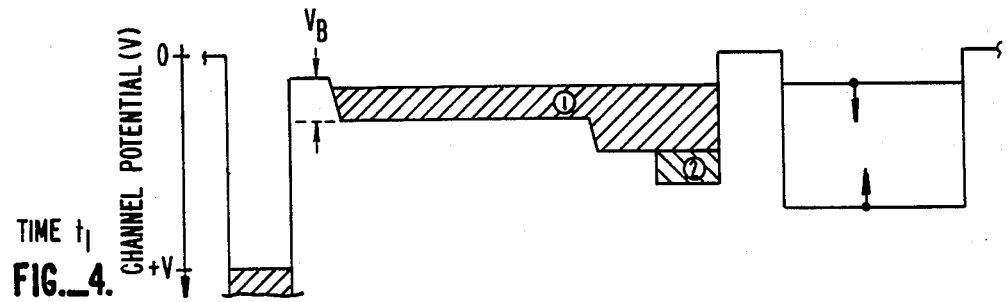
TIME $t_1$
FIG._4.
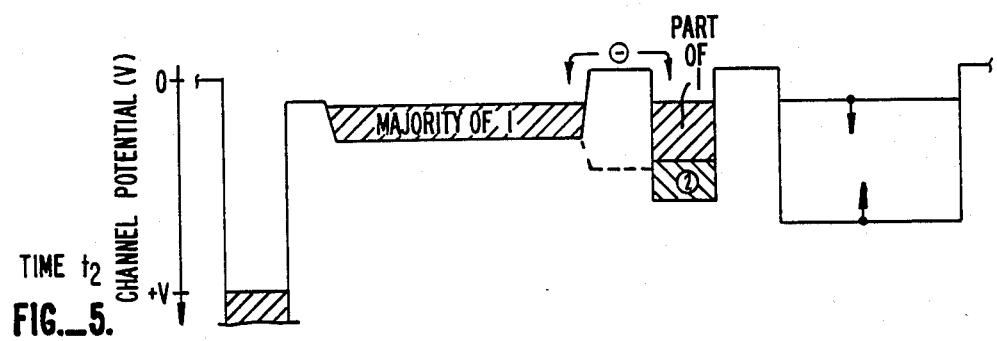
TIME $t_2$
FIG._5.
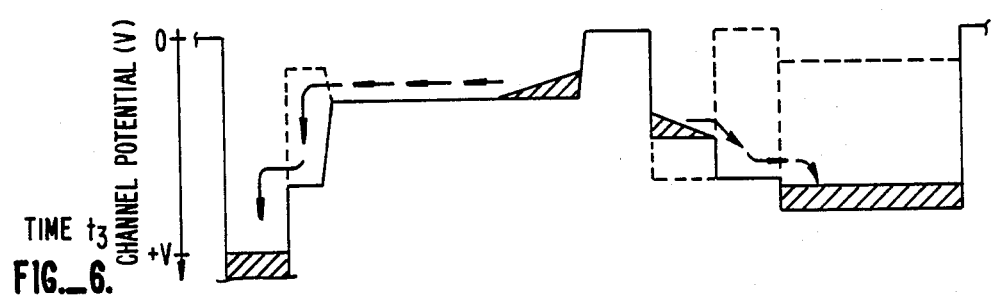
TIME $t_3$
FIG._6.
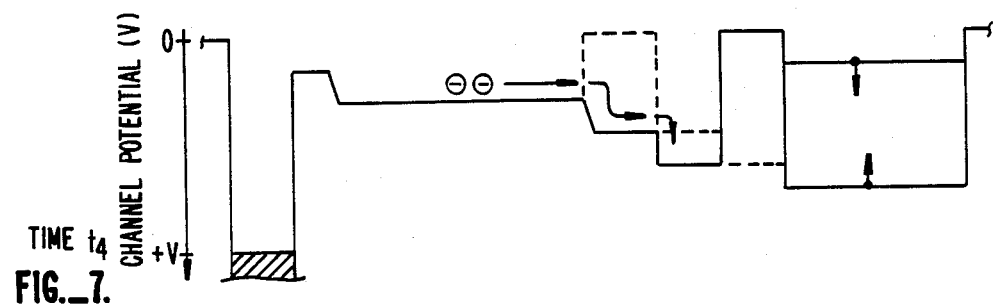
TIME $t_4$
FIG._7.

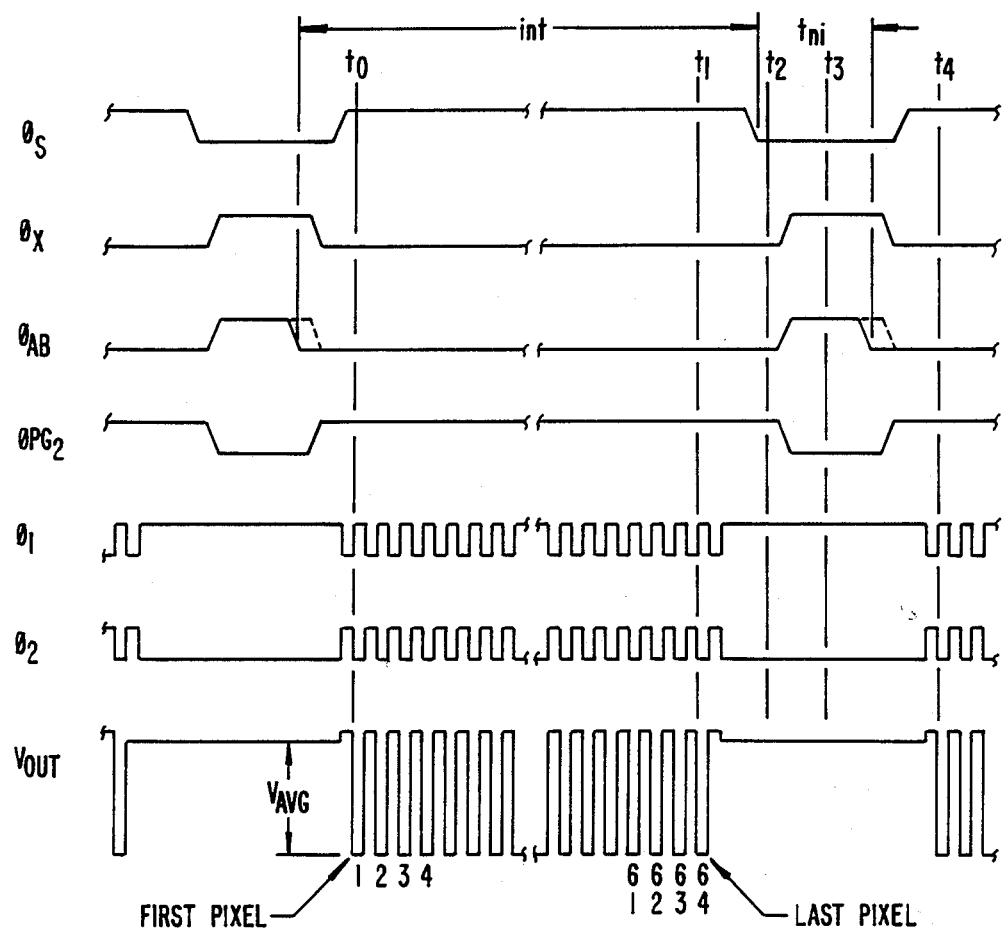
FIG._8.

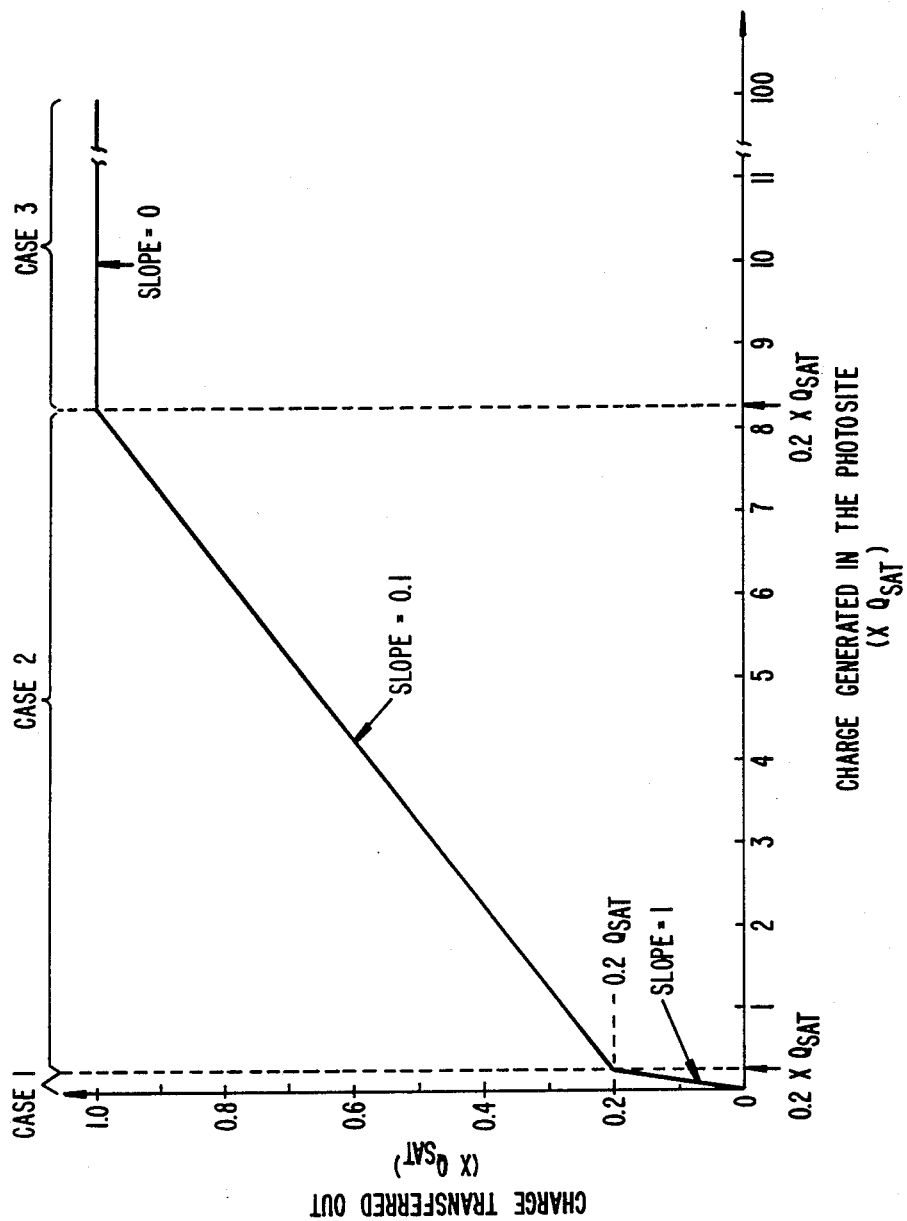

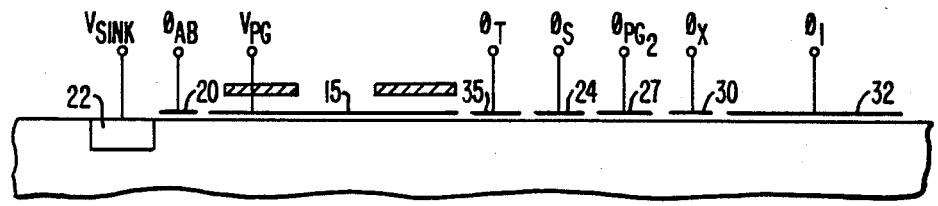
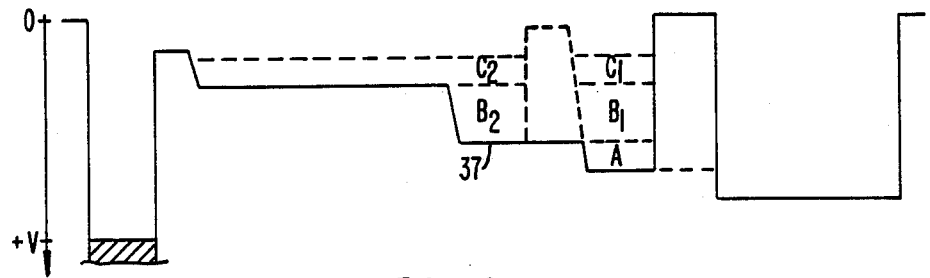
FIG._10.
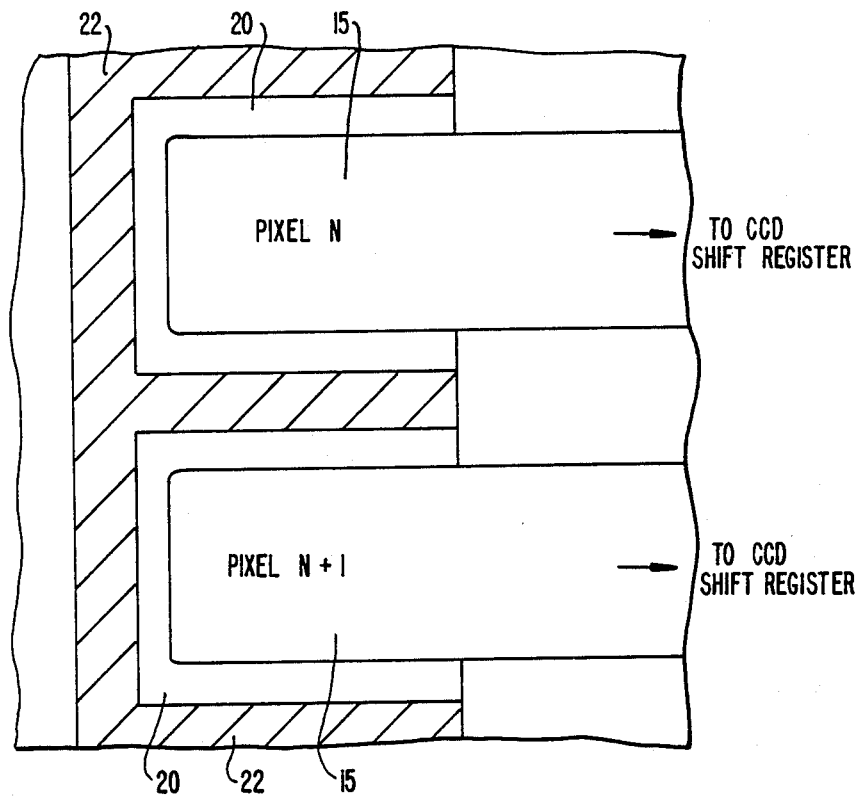
FIG._11.

HIGH DYNAMIC RANGE CHARGE-COUPLED DEVICE

BACKGROUND OF THE INVENTION

1. Field of the Invention

This invention relates to semiconductor devices in which charge is manipulated, and in particular, to a charge-coupled device ("CCD") in which a charge collection circuit collects all of an input signal at low signal levels, but collects less of the input signal at higher signal levels, thereby extending its dynamic range.

2. Description of the Prior Art

Charge-coupled devices, bucket brigade devices and other semiconductor devices in which charge is manipulated are now well known. Such devices are used as shift registers, as memory cells, in analog signal processing as filters, and as charge-coupled imaging devices, both for line scan and area imaging purposes. The operation of these devices is similar in that depletion regions are created in a semiconductor substrate by application of an electric field. Packets of charge are then manipulated in the depletion regions. In charge-coupled devices an initial charge is injected electrically (memory cells) or results from electron-hole pair generation (imaging devices) as a result of photon bombardment. Charge-coupled imaging devices allow optical integration of ambient electromagnetic radiation over a period of time. The resulting image/charge information then is transferred out of the regions where it accumulated into shift registers, or other means, so that the accumulated charge may be detected and amplified, or used to provide other signals.

In a typical prior art charge-coupled device, charge accumulates in a semiconductor substrate in a potential well (depletion region), defined by an overlying photogate electrode. Should the three-dimensional well beneath the photogate become saturated with charge, the charge carriers spread away from the light-sensing element and "blooming" occurs. Blooming is the spreading of the charge originally accumulated in a light-sensing element in such a way that this charge appears to have originated in other nearby light-sensing elements. This, adjacent to the photogate electrode is an antiblooming structure to absorb charge greater than the maximum amount which may accumulate under the electrode to prevent that excess charge from overflowing into surrounding photogates and destroying the image. A transfer gate electrode and transfer structure ae formed adjacent an opposite edge of the photogate. During the optical integrated period, the transfer gate is maintained at a potential to confine the accumulating charge beneath the photogate. When the optical integrated time ends, a signal is applied to the transfer gate to lower the electrical "barrier" to the transfer gate induces in the substrate, and allow the accumulated charge to flow beneath the transfer gate into an adjoining shift register element, or the like. The transfer gate then is returned to its original position to allow further accumulation of charge beneath the photogate. Meanwhile, a shift register is to transfer the charge packet to a sense amplifier or other apparatus for measurement or subsequent processing.

An unfortunate limitation on prior art charge-coupled devices is the relationship between the amount of charge which may be accumulated beneath the photogate and the charge-handling capability required of all of the peripheral circuitry, such as the shift register. Increasing the size of the photogate allows more charge to accumulate over a given period; however, such an increase in size also places a correspondingly higher requirement on the charge-handling capability of the shift register or other circuitry. Thus, the design of charge-coupled devices of a size sufficient to provide wide dynamic range is undesirably increased by the extra charge-handling capability required. The increase in size of the shift registers and associated peripheral circuitry undesirably increases the size of the die involved, thereby lowering the yield of functional devices and increasing the price for each device. Viewed alternatively, the increased size of the peripheral charge-handling circuitry, decreases the amount of chip area available for photosensing, and thereby lowers the dynamic range of the device.

SUMMARY OF THE INVENTION

I have developed a charge-coupled device which overcomes the compromise inherent in prior art devices of limiting the dynamic range of the device to avoid undesirably increasing the charge-handling capability and thereby diminishing the sensitivity. In my invention the dependency of the size of the photoelements upon the charge-handling capability of the device is greatly reduced. I have developed a technique which allows the charge-coupled device to maintain maximum sensitivity (by having large photoelements) yet maintain the charge-handling capability at a reasonable level. I achieve my invention by providing the charge-coupled device with a nonlinear relationship between the charge accumulated in the photosite and the charge which is transferred out to surrounding circuitry from the photoside. In one embodiment all of the charge accumulated in the photoside is transferred into the shift register until a desired level is reached, and at that point only a small fraction of the charge accumulated is transferred out. In other embodiments of my invention, all of a first small amount of charge which accumulates is transferred out, while a smaller fraction of the next amount of charge which accumulates is transferred, and a still smaller fraction of the following accumulation transferred, etc. As will be described below, the transfer characteristics of the charge transfer device of my invention may be adjusted as desired.

In a preferred embodiment, a semiconductor structure fabricated according to my invention includes a substrate in which an accumulation region is defined for the accumulation of charge in response to ambient optical radiation. The accumulation region is defined by a photogate disposed in proximity to the substrate to thereby create a depletion region in the substrate of a first depth. Spaced apart from the photogate is a storage gate which is also disposed in proximity to the substrate create a depletion region in the substrate of a second depth. The photogate and storage gate are separated by at least one intervening sampling gate which creates a depletion region in the substrate of a depth between the first and second depth.

With small amounts of charge, all will flow into the region beneath the storage gate (the deepest potential well). As the amount of charge increases, however, more and more of it will accumulate beneath the sampling gate and beneath the photogate. Once the optical integration period is complete, the sampling gate is pulsed to separate the charge beneath the storage gate from that beneath the photogate. Because the charge beneath the storage gate represents all of the small amount of charge first accumulated and a fraction of any subsequent charge accumulated, the amount of charge beneath the storaage gate will accurately represent the total accumulated charge, but without requiring the total accumulated charge itself to be handled by the other circuitry on the charge-coupled device.

Therefore, my invention provides a charge collection circuit which collects all of the input signal at low signal levels, but collects only a fraction of the input signal at higher signal levels. The CCD therefore maintains maximum sensitivity while reducing the charge-handling capability requirement for large signal levels. When used in conjunction with charge-coupled device registers which have certain maximum charge-handling limitations, the circuit of my invention increases the dynamic range of the overall device.

BRIEF DESCRIPTION OF THE DRAWINGS

FIG. 1 is a schematic view of a cross section of a semiconductor structure of the preferred embodiment of this invention illustrating the electrodes of the charge-coupled device;

FIG. 2 is a cross-sectional diagram illustrating the depth of the depletion region created by the electrodes of FIG. 1 at a time $t_0$;

FIG. 3 is a schematic representation of depth of the depletion region at a time $t_3$ for an amount of charge generated in the photosite which is less than 20% of the saturation charge;

FIG. 4 is a schematic representation of the depth of the depletion region at a time $t_1$ for a pixel charge in excess of the saturation charge;

FIG. 5 is a schematic representation of the depth of the depletion region at a time $t_2$;

FIG. 6 is a schematic representation of the depth of the depletion region at a time $t_3$ for a pixel charge in excess of the saturation charge;

FIG. 7 is a schematic representation of the depth of the depletion region at a time $t_4$;

FIG. 8 is a timing diagram illustrating the relationship of the signals applied to the electrodes of FIG. 1 with times $t_0$ to $t_4$ designated thereon;

FIG. 9 is a graph illustrating the relationship of the charge transferred out of a photosite to the charge generated in the photosite;

FIG. 10 is a schematic diagram illustrating another embodiment of the invention together with the resulting depletion region profile; and FIG. 11 is a top view of an alternative arrangement of the gates and antiblooming region of FIGS. 1 or 10.

DETAILED DESCRIPTION OF THE PREFERRED EMBODIMENTS

FIG. 1 is a schematic cross-sectional representation of a semiconductor structure fabricated according to my invention. The structure shown in FIG. 1 includes a semiconductor wafer 10. Disposed across the upper surface of wafer 10, but separated therefrom by an insulating layer (not shown) are a series of electrodes, typically metal or polycrystalline silicon. Photogate electrode 15 in conjunction with light shield 18 defines a region of the silicon body wherein charge carriers are accumulated in response to incident light. The incident light represented in FIG. 1 by the arrow hv causes electron-hole pair generation, and the electrons accumulate in the depletion regions beneath the biased electrodes. Each photogate therefore defines a picture element or pixel. Because the electrons accumulate in the depletion region in an amount proportional to the integral of the light incident on the exposed photoelement, they represent the product of the intensity of the incident light and the duration of the integration period. The light shield 18 prevents ambient light from striking other portions of the structure which would result in charge accumulation at those locations, thereby introducing errors into the detector.

Formed adjacent to photogate 15 is an anti-blooming structure for the purpose of receiving excess charge from the photogate. Sufficiently intense incident light, or a long integration period, would result in the accumulation of more charge than can be stored beneath the photogate, and excess charge, absent the antiblooming structure, would overflow into surrounding areas of the structure introducing errors. The antiblooming structure may be of any well known type; however, as depicted in FIG. 1 the structure includes a gate 20 for establishing an antiblooming barrier potential in the substrate, together with a charge sink diode region 22 to transfer the excess charge away from the sensor to an external power supply. The antiblooming sink 22 consists of an N+ diffusion or implantation region in the P-type wafer 10. An appropriate sink potential $V_{sink}$ is applied to the diffusion 22 to create a sufficiently deep channel potential beneath it. The amount of charge required to saturate the photoelement is defined by the height of the antiblooming barrier, established by electrode 20, with respect to the depth of the channel region, established by the potential $V_{PG1}$ applied to the photogate 15. If the saturation charge is to be increased, then the difference $V_B$ (see FIG. 2) between these two potentials must also be increased. The potential wells formed beneath the electrode structure of FIG. 1 are bounded in the direction perpendicular to the drawings by channel stop diffusions to prevent charge from flowing other than to the left or right in the context of the drawings.

Disposed on the other side of the photogate 15 from the antiblooming structure are a photosite sampling gate 24, a storage gate 27, a transfer gate 30, and a shift register, of which one electrode 32 is shown. The shift register extends into the plane of the drawing. A clocked signal $\phi_S$ is applied to electrode 24, while the clock signal $\phi_{PG2}$ is applied to electrode 27, and a clock signal $\phi_X$ is applied to electrode 30. These signals are illustrated in FIG. 8.

In a typical charge-coupled device hundreds or thousands of photosites are provided arranged either linearly or in a matrix. After a certain integration period, the accumulated charge packets generated by the incident light are transferred, in parallel, to the shift registers 32 by application of appropriate potentials to the sampling gate 24, storage gate 27, and transfer gate 30. (This operation is explained below.) Once the charge has been transferred to the shift registers, these registers transfer it to appropriate output detection circuitry, for example, an output amplifier or the like.

The operation of the structure shown in FIG. 1 may be more readily understood with respect to FIGS. 2 and 3 in conjunction with the signal timing diagram of FIG. 8. FIG. 2 schematically illustrates the profile of the depletion region or space charge layer at time $t_0$ (see FIG. 8). Note that the more positive potential is plotted in the downward direction in FIGS. 2 through 7 and FIG. 10. When the voltage applied to an electrode is increased, the potential under the electrode is increased, and the potential diagram is lowered in the figures. In FIG. 2 at time $t_0$ the transfer gate 30 control signal $\phi_X$ is turned off to isolate the photosites from the shift register. The control signal $\phi_{AB}$ to the antiblooming gate 20 is held partially on to create a channel potential barrier $V_B$ between the photosite and the antiblooming sink diode 22. As time passes light striking the substrate 10 causes charge to be generated in the photosite. Because the control signal $\phi_S$ to the photosite sampling gate 24 is more positive than the photogate potential $V_{PG1}$, yet less positive than the control signal $\phi_{PG2}$ to storage gate 27, charge generated in the photosite will cascade across the photogate 15 and the sampling gate 24 into the potential well beneath storage gate 27.

For clarity of explanation, let $Q_{pixel}$ be defined as the amount of charge generated in a photosite during one integration period, while $Q_{saturation}$ is the maximum amount of charge that the shift register can accept from a photosite and operate efficiently. The integration time is the time elapsing between the time at which the antiblooming barrier potential $V_B$ is established (thereby preventing charge flow out of the photogate and into the antiblooming structure), and the time at which the sampling gate is turned off to separate the photogate 15 from the storage gate 27. The percentage of the charge accumulating beneath the photogate 15, $Q_{pixel}$, which is transferred into the shift register, depends upon the ratio of the pixel charge $Q_{pixel}$ to the saturation charge $Q_{saturation}$. There are three possible cases which are referred to herein as small pixel charge, large pixel charge, and overflowing pixel charge.

In the first case, small pixel charge, described in conjunction with FIG. 3 below, the pixel charge is sufficiently small (about 20% of $Q_{saturation}$) so that all of it is trapped beneath the storage gate at the end of the integration period when the photosite sampling gate 24 is turned off. This small amount of charge is designated "2" in FIG. 2.

FIG. 3 shows the depletion profile at time $t_3$. By this time the sampling gate potential has been lowered to separate the charge packet 2 from any further charge accumulation beneath photogate 15. The control signal $\phi_X$ to transfer gate 30 and $\phi_{PG2}$ to storage gate 27 then cause the accumulated charge 2 to flow out from beneath the storage gate and into the shift register, as depicted in FIG. 3. To prepare the photogate for the next integration period, the antiblooming barrier potential $\phi_{AB}$ is lowered to cause any charge accumulating beneath photogate 15 to drain into the sink diode.

In the second case, large pixel charge, the pixel charge is greater than the amount of charge which may be stored beneath the storage gate 27, but less than the amount of charge required to overflow the antiblooming barrier potential $V_B$. As shown by FIG. 4 in this case the well beneath the storage gate 27 is quickly flooded by part of the pixel charge. Because in the preferred embodiment the charge storage capacity of the photogate will be more than ten times larger than the charge storage capacity of the storage gate 12, most of the pixel charge is accumulated beneath the photogate 15. Although some charge also accumulates beneath the sampling gate 24, the sampling gate is made as small as possible to minimize the amount of charge accumulating thereunder. The part of the pixel charge in excess of the small pixel charge is labeled "1" in FIG. 4.

FIG. 5 shows the relative well depth at time $t_2$, which is at the end of the integration period after the sampling gate 27 is turned off. As the sampling gate is turned off, a small amout of the pixel charge is sampled and stored in the storage gate area 27. The small sampling gate also minimizes the amount of charge which spills back into either the well beneath the photogate 15 or the well beneath the storage gate 27.

As shown by FIG. 6, at time $t_3$ immediately after the sampling gate is turned off, the transfer gate 30 and the antiblooming barrier gate 20 are turned on. As a result, all of the small signal pixel charge which accumulated beneath the storage gate 27, as well as a fraction of the large pixel charge accumulating beneath electrode 15, and transferred into the shift register. The remainder of the charge beneath photogate 15 is dumped into the antiblooming sink diode. Next, as shown by FIG. 7, the potentials are re-established for the beginning of the integration period, and the cycle is repeated.

In the third case of operation, overflowing pixel charge is accumulated beneath the photogate 15 during the integration period as to overflow the antiblooming channel potential barrier $V_B$ into the antiblooming sink diode. Sampling and charge transfer then proceed as discussed above with respect to the second case.

FIG. 8 is a timing diagram illustrating the signals applied to the electrodes shown in FIG. 1. The timing diagram includes signals $\phi_S$, $\phi_X$, $\phi_{AB}$, $\phi_{PG2}$, and $\phi_1$, all of which have been discussed above. Signal $\phi_2$ is a signal used to provide the other phase of the shift register elements for transferring the signal charge to the output amplifier or other apparatus. Signal $V_{out}$ represents the output signal from the output amplifier for a set of 64 pixels disposed along the shift register, of which a single pixel is shown in the Figures.

The integration period $t_{int}$ is shown, as well as a short period $t_{ni}$ which occurs after each integration period when the photosite do not accumulate charge. Charge generated during this period flows into the antiblooming sink diode along with the unsensed large pixel charge. This nonintegration period begins when the photosite sampling gate is turned off and ends when the antiblooming barrier is turned off. The duration of the nonintegration period is essentially determined by the required clock high time for the antiblooming barrier.

The antiblooming barrier must be on long enough to drain the photogate region of the unused large-signal pixel charge. The photogate region is much larger than the shift register gates because it must store much more charge, typically ten times more charge, than the shift registers. A technique for reducing this nonintegration time is described in conjunction with FIG. 11.

FIG. 9 is a graph illustrating the relationship of the charge transferred out by the shift register to the charge generated in the photosite. The charge transferred out is shown as a ratio to the saturation charge which is the maximum charge the shift register can efficiently transfer. The charge generated in the photosite is also shown as a ratio to the saturation charge.

As shown by FIG. 9, for the respective dimensions of the storage gate and photogate, the first 20% of the saturation charge generated in the photosites will be transferred out by the shift registers and completely sensed. This corresponds to the first case above. When the charge generated in the photoside is between the 20% of saturation charge and 8.2 times the saturation charge, the charge transferred out will be related to the charge generated in the photosite by the portion of the graph having a slope of 0.1. Thus, the charge transferred out will not reach the saturation level of the shift register until the charge generated in the photosite is 8.2 times the saturation level. This corresponds to the second case discussed above.

Finally, as also shown in FIG. 9, once the charge generated in the photosite exceeds 8.2 times the saturation level charge, the charge transferred out will be equal to the saturation level for all higher values of charge generated in the photosite. This circumstance corresponds to the third case discussed above.

The technique described in conjunction with FIGS. 1-9 may be extended to a larger number of electrodes, for example, as depicted in FIG. 10. The schematic charge-coupled device structure shown there is the same as in FIG. 1 except that an additional gate 35 has been provided to create another step 37 in the depletion region profile as shown in the lower part of FIG. 10. Thus, for a pixel charge level smaller than quantity A, all of the charge will accumulate in the well beneath the storage gate 27. When the transfer gate is next pulsed, all of that charge will transfer to the shift register to provide 100% collection efficiency. If the pixel charge is greater than A, then charge will overflow the well beneath the storage gate, and some of the charge will be stored beneath gate 35. When the sampling gate is clocked, only the charge represented by quantities A and $B_1$ is collected in the shift register, while the charge quantity represented by $B_2$ will not be collected.

If still further charge is accumulated under the photogate, for example, a quantity which overflows into the well beneath the gate 15, then in the same manner as described above, charge quantities $A+B_1+C_1$ will be collected in the shift register. Thus, by the addition of extra electrodes, such as electrode 35, the dynamic range of the charge-coupled device can be extended further. For the structure of FIG. 10, the relationship between charge transferred out and charge generated in the photogate will be similar to that depicted in FIG. 9, except that instead of containing two linear sections, a high gain section with a slope of 1 and a low gain section with a slope of 0.1, the curve will contain three linear sections, and the point at which the charge transferred out reaches the saturation charge will be pushed further to the right. For example, if 1% of the pixel charge which is between 60% and 100% of the saturation charge is sampled, the transfer curve will contain a third linear region with a slope of 0.01 and the dynamic range of the device will be increased from 8.2 to 44 times the saturation charge. It should therefore be apparent that as many electrodes as desired may be added to extend the dynamic range of the device to any specified level.

In the example discussed in conjunction with FIG. 10, the additional gate 35 has about 100 times the area of the storage gate. Unfortunately, as the gates increase in area, the time required to remove the unsampled charge $B_2$, $C_2$, etc., back to the sink diode increases. To overcome this difficulty, I have developed the structure shown in FIG. 11. Shown there are the photogate electrodes 15 for each of two adjacent pixels N and N+1. Instead of having the antiblooming structure disposed only along the left-hand edge of those pixels, the antiblooming electrode 20 and sink diode 22 are positioned not only at the ends of the photoelements but wrap around the photogate on three sides. As a result, charge need only travel a short distance to reach the sink diode. Importantly, the antiblooming structure can be positioned under light shield 18. It does not alter the photosensitive region of the array, and therefore does not effect any optical characteristics of the array.

Although a preferred embodiment of the invention has been described above, it should be understood that this embodiment is for the purposes of illustration and includes many specific details. It should be appreciated, for example, that the number of gates and storage regions may be varied to obtain the desired transfer characteristics. In addition, it should be appreciated that the desired potentials beneath the various electrodes can be achieved using different techniques, for example, different thickness dielectric layers, different substrate impurity doping, or other suitable techniques may be employed. Furthermore, although separate electrodes are depicted to establish the differing charge transfer well depths, a single electrode may be employed for the photogate and intermediate gates between it and the sampling gate wherein such a single gate has a high resistivity and different voltages applied to opposite ends thereof to create a smooth potential drop, and thereby a smooth depletion region profile. Accordingly, the scope of the invention may be ascertained from the following claims.

I claim:

1. A semiconductor structure comprising:
    a semiconductor substrate;
    photogate means disposed in proximity to the substrate for creating a first depletion region in the substrate of first depth for the accumulation of charge in response to ambient electromagnetic radiation, the first depletion region being capable of containing a first quantity of charge;
    storage gate means, spaced apart from the photogate means, disposed in proximity to the substrate for creating a second depletion region in the substrate of second depth, the second depth being greater than the first depth and the second depletion region being capable of containing a second quantity of charge less than the first quantity; and
    sampling gate means disposed between the photogate means and the storage gate means for controllably isolating the second depletion region from the first depletion region to allow transfer of the second quantity of charge from the second epletion region without the first quantity of charge.

2. A semiconductor structure as in claim 1 further comprising:
    transfer gate means disposed adjacent the storage gate means for controlling transfer of charge from the second depletion region; and
    shift register means separated from the storage gate means by the transfer gate means for receiving the second quantity of charge from the storage gate means.

3. A semiconductor strucuture as in claim 1 further comprising at least one additional gate means sequentially arranged between the photogate means and the sampling gate means.

4. A semiconductor structure as in claim 3 wherein the at least one additional gate means comprise a gate for creating a third depletion region in the substrate depth between the first depth and the second depth.

5. A semiconductor structure as in claim 3 wherein the at least one additional gate means comprises a plurality of additional gate means arranged to create progressively deeper depletion region extending from a shallow depletion region adjacent the photogate means to a deeper depletion region adjacent the sampling gate means.

6. A semiconductor structure as in claim 1 wherein each of the photogate means, storage gate means and the sampling gate means comprises a separate electrode disposed above the substrate but separated therefrom by insulating material.

7. A semiconductor structure as in claim 1 further comprising:
antiblooming means disposed adjacent the photogate means for receiving excess charge therefrom.

8. A semiconductor structure as in claim 7 wherein the antiblooming means comprises:
antiblooming electrode means disposed in proximity to the substrate for establishing a depletion region in the substrate at a fourth depth shallower than the first depth;
charge sink means separated from the photogate means by the antiblooming electrode means for receiving charge from the first depletion region under control of the antiblooming electrode means.

9. A semiconductor structure as in claim 8 wherein:
the photogate means comprises a photogate electrode disposed above the substrate;
the antiblooming electrode means comprises an electrode disposed above the substrate and to partially surround the photogate electrode.

10. A semiconductor structure as in claim 9 wherein:
the charge sink means comprises a doped region in the substrate of opposite conductivity type to the substrate partially surrounding the antiblooming electrode.

11. A semiconductor structure as in claim 1 further comprising means for supplying varying electrical signals to the sampling gate means to thereby raise and lower the potential of the depletion region thereunder.

12. A charge-coupled device comprising:
a semiconductor substrate;
a photogate electrode disposed in proximity to the substrate for establishing a first depletion region of first potential depth in the substrate capable of containing a first quantity of charge;
a storage electrode spaced apart from the photogate electrode and disposed in proximity to the substrate for establishing a second depletion region of second potential depth in the substrate capable of containing a second quantity of charge less than the first quantity; and
an intervening sampling electrode disposed in proximity to the substrate and separating the storage electrode from the photogate electrode, the sampling electrode for controllably isolating the first depletion region from the second depletion region.

13. A device as in claim 12 wherein the photogate electrode comprises an electrode to which a reference potential is supplied.

14. A method of increasing the dynamic range of a charge-coupled device comprising:
in a semiconductor substrate establishing a first depletion region capable of accumulating a first quantity of charge in response to ambient light;
establishing a second depletion region capable of containing a second quantity of charge smaller than the first quantity, the second depletion region being spaced from the first depletion region;
establishing a variable potential depth depletion region between the first and the second depletion regions;
raising the potential of the variable depth depletion region to allow charge to flow from the first depletion region to the second depletion region;
lowering the potential of the variable depth depletion region to prevent any remaining charge in the first depletion region from flowing into the second depletion region; and
transferring charge from the second depletion region out of that region.

15. A method as in claim 14 wherein the step of establishing a first depletion region comprises applying a fixed potential to a photogate electrode.

16. A method as in claim 15 wherein the step of establishing a second depletion region comprises applying a first electrical signal to a storage gate electrode.

17. A method as in claim 16 wherein the step of establishing a variable depth depletion region comprises applying a second electrical signal to a sampling gate electrode disposed between the photogate electrode and the storage gate electrode.

* * * * *